United States Patent
Hung et al.

(10) Patent No.: US 10,977,121 B2
(45) Date of Patent: Apr. 13, 2021

(54) FAST PAGE CONTINUOUS READ

(71) Applicant: MACRONIX INTERNATIONAL CO., LTD., Hsinchu (TW)

(72) Inventors: Shuo-Nan Hung, Zhubei (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/533,463

(22) Filed: Aug. 6, 2019

(65) Prior Publication Data

US 2020/0125443 A1    Apr. 23, 2020

Related U.S. Application Data

(60) Provisional application No. 62/746,770, filed on Oct. 17, 2018, provisional application No. 62/746,911, filed on Oct. 17, 2018.

(51) Int. Cl.
*G06F 11/10*    (2006.01)
*H03M 13/15*    (2006.01)
(Continued)

(52) U.S. Cl.
CPC ...... *G06F 11/1068* (2013.01); *G11C 11/4093* (2013.01); *G11C 11/4094* (2013.01); *H03M 13/1545* (2013.01)

(58) Field of Classification Search
None
See application file for complete search history.

(56) References Cited

U.S. PATENT DOCUMENTS 5,768,215 A    6/1998 Kwon et al.
6,615,307 B1    9/2003 Roohparvar
(Continued)

FOREIGN PATENT DOCUMENTS

CN    103871447 B    3/2017
JP    2003529883 A    10/2003
(Continued)

OTHER PUBLICATIONS

EP Extended EP Search Report from Application No. 19200579.1 dated Mar. 10, 2020, 8 pages.
(Continued)

*Primary Examiner* — April Y Blair
*Assistant Examiner* — Matthew W Wahlin
(74) *Attorney, Agent, or Firm* — Haynes Beffel & Wolfeld LLP

(57) ABSTRACT

A memory device such as a page mode NAND flash is operated, using a first pipeline stage, to clear a page buffer to a second buffer level, and transfer a page to the page buffer; a second pipeline stage to clear the second buffer level to the third buffer level and transfer the page from the page buffer to the second buffer level; a third pipeline stage to move the page to the third buffer level and execute in an interleaved fashion a first ECC function over data in a first part of the page and output the first part of the page while performing an second ECC function, and to execute the first ECC function over data in a second part of the page in the third buffer level, and to output the second part while performing the second ECC function.

20 Claims, 11 Drawing Sheets

(51) Int. Cl.
*G11C 11/4093* (2006.01)
*G11C 11/4094* (2006.01)

(56) References Cited

U.S. PATENT DOCUMENTS

| | | | |
|---|---|---|---|
| 7,423,915 B2* | 9/2008 | Leong | G06F 12/0893 |
| | | | 365/185.12 |
| 8,261,008 B2 | 9/2012 | Que | |
| 8,358,558 B2 | 1/2013 | Lee et al. | |
| 8,375,273 B2 | 2/2013 | Hara | |
| 8,705,293 B2 | 4/2014 | She et al. | |
| 8,902,668 B1 | 12/2014 | Dutta et al. | |
| 9,009,566 B2 | 4/2015 | Hung et al. | |
| 9,053,762 B2 | 6/2015 | Hirobe | |
| 9,136,006 B2 | 9/2015 | Hung et al. | |
| 9,349,469 B2 | 5/2016 | Chen et al. | |
| 9,411,521 B2 | 8/2016 | Lu et al. | |
| 9,483,348 B2 | 11/2016 | Yun | |
| 9,536,601 B1 | 1/2017 | Chen et al. | |
| 9,552,882 B2 | 1/2017 | Tseng et al. | |
| 9,690,650 B2 | 6/2017 | Liu et al. | |
| 9,971,647 B2 | 5/2018 | Michael | |
| 2003/0093744 A1 | 5/2003 | Leung et al. | |
| 2004/0109358 A1 | 6/2004 | Roohparvar et al. | |
| 2006/0146607 A1 | 7/2006 | Hosono et al. | |
| 2009/0168530 A1 | 7/2009 | Yamamura et al. | |
| 2011/0063748 A1 | 3/2011 | Song et al. | |
| 2013/0145093 A1 | 6/2013 | Kaminaga et al. | |
| 2013/0286752 A1 | 10/2013 | Michioka et al. | |
| 2013/0346671 A1 | 12/2013 | Michael et al. | |
| 2014/0258811 A1 | 9/2014 | Liu et al. | |
| 2015/0255167 A1 | 9/2015 | Gillingham et al. | |
| 2016/0034346 A1* | 2/2016 | Michael | H03M 13/27 |
| | | | 714/755 |
| 2016/0372184 A1 | 12/2016 | Shalvi et al. | |
| 2017/0185353 A1 | 6/2017 | Intrater et al. | |
| 2018/0090202 A1 | 3/2018 | Kaminaga et al. | |
| 2018/0143908 A1 | 5/2018 | Zhang et al. | |
| 2020/0142843 A1 | 5/2020 | Hung | |

FOREIGN PATENT DOCUMENTS

| | | |
|---|---|---|
| JP | 2009158015 A | 7/2009 |
| JP | 2013118031 A | 6/2013 |
| TW | 201421238 A | 6/2014 |
| TW | 201830404 A | 8/2018 |
| WO | 0175896 A2 | 10/2001 |

OTHER PUBLICATIONS

Macronix International Co., Ltd. Technical Note, "Improving NAND Throughput with Two-Plane and Cache Operations," Rev. 1, Nov. 15, 2013, 13 pages.

Micron Technology, Inc. Technical Note "NAND Flash 101: An Introduction to NAND Flash and How to Design it in to Your Next Product," TN-29-19, Rev. B, at least as early as Dec. 2006, 27 pages.

Micron Technology, Inc. Technical Note "NAND Flash Performance Increase Using the Micron Page Read Cache Mode Command," TN-29-01, at least as early as Dec. 2004, 10 pages.

"3V, 2G/4G-bit NAND Flash Memory, MX30LFx4G18AC", Macronix International Co., Ltd., http://www.macronix.com, Revision 1.4, Jan. 20, 2017, 80 pages.

U.S. Office Action in U.S. Appl. No. 16/581,562 dated Aug. 10, 2020, 8 pages.

U.S. Office Action in U.S. Appl. No. 16/544,055 dated Aug. 13, 2020, 22 pages.

JP Office Action in 2019-185125 dated Oct. 19, 2020, 6 pages.

TW Office Action in 10920963630 dated Oct. 7, 2020, 4 pages.

* cited by examiner

FAST PAGE CONTINUOUS READ

PRIORITY APPLICATION

This application claims the benefit of U.S. Provisional Patent Application No. 62/746,770 filed 17 Oct. 2018 (MXIC 2273-0) and 62/746,911 filed 17 Oct. 2018 (MXIC 2271-0) which applications are incorporated herein by reference.

BACKGROUND

Field

The present invention relates to integrated circuit memory devices, such as NAND flash devices, that support continuous read operations, and particularly continuous page read operations.

Description of Related Art

Read latency, sometimes specified as tR, is the time between receiving a read command and the time at which data requested by the read command is available at the output.

This type of latency can be relatively long in NAND flash devices. As a result, NAND flash can be considerably slower than other types of memory, such as NOR flash, for some operations.

Command sequences known as cache read and as continuous read have been developed to address this latency for NAND flash devices.

In the cache read command sequence, the latency tR can be reduced by overlapping some of the procedures, such as error checking and correcting using a cache or other buffer memory structure on the device. The latency that is encountered in a cache read command sequence is sometimes specified as tRCBSY. This can improve the throughput of the system using NAND flash. In a continuous command sequence, NAND flash devices have been configured to output sequential pages after the initial latency (tR), so that the sequential pages are available without delay between the pages. Continuous read operations for NAND flash can include three basic steps, as follows:

(Step 1) Start phase: the host needs to issue a page read (C1) command to read out the data of the new page address to the cache. It takes a read latency tR to read out the page data.

(Step 2) Sequential Continuous read phase: the host reads out the data from the interface on the memory device continuously in this phase.

(Step 3) End phase: Depending on the read protocol, the host either needs to issue "end" (C3) command (some common NAND Flash devices) or raise the CS from 0 to 1 (SPI NAND Flash devices) to terminate the sequential continuous read operation. It can take a reset latency tRST to terminate the sequential continuous read operation.

However, even for continuous read operations, the latency involved remains significant in some settings. Performance can be determined by how fast one page of data can be read out in step 2 above, for example.

It is desirable to provide a technology which can reduce the latency for continuous read operations in NAND flash and other types of memory devices.

SUMMARY

A memory device, such as a page mode NAND flash including a page buffer, and an input/output interface for I/O data units having an I/O width less than the page width supports continuous page read. The input/output interface can comprise a serial interface (e.g. SPI), or a parallel interface. Technology described herein can provide a performance improvement based on operations that use of three buffer levels. Also, technology described herein can provide a performance improvement based on operations that use two-stage ECC operations.

A memory device is described that includes a memory array including a plurality of bit lines; a page buffer coupled to the plurality of bit lines having a page width; an input/output interface for I/O data units which can have an I/O width less than the page width; data path circuits connected between the page buffer and the interface, the data path circuits including a second buffer level and a third buffer level; a controller responsive to commands received at the input/output interface, to control memory operations including a continuous page read operation to output a stream of pages at the input/output interface, the continuous read operation including transferring a page of data having page width from the memory array to the page buffer in a page read interval, transferring the page of data from the page buffer to the second buffer level, transferring the page of data from the second buffer level to the third buffer level, and transferring the page of data from the third buffer level to the input/output interface; and ECC circuits connected to the data path circuits, which execute an ECC operation on pages in the data path circuits.

The ECC operation can include executing a first ECC function on pages held in the data path circuits and executing a second ECC function during transfer of data in the stream of pages of the continuous read operation from the data path circuits to the input/output interface. Also, the memory device can include a buffer data bus system operable to connect the ECC circuits to the second buffer level for execution of the first ECC function. Alternatively, the memory device can include a buffer data bus system operable to connect the ECC circuits to the third buffer level for execution of the first ECC function.

A controller can be provided to control a continuous page read operation to output a stream of pages at the I/O interface. The continuous page read operation can include a method for operating a memory device for a read of a stream of pages, the device including a page buffer, a second buffer level, a third buffer level and an input/output interface, comprising in a first stage, moving data of a preceding page from the page buffer to the second buffer level, and transferring a current page from a memory array to the page buffer; in a second stage, moving data of the preceding page from the second buffer level to the third buffer level and transferring the current page from the page buffer to the second buffer level; in a third stage, transferring data from a first part of the preceding page from the third buffer level to the interface, and then transferring data from a second part of the preceding page from the third buffer level to the interface; and performing an ECC operation over the current page during transfer of the current page from the page buffer to the interface through the second and third buffer levels.

In embodiments described herein, the data path circuits can include buffer memory. Also the device can include error checking and correction ECC circuits connected to the data path circuits. The ECC circuits execute ECC functions on pages in the data path circuits before enabling output of the pages at the input/output interface of the device. The ECC circuits can operate with data chunks having an ECC chunk with less than the page width, and greater than the I/O width.

The data path circuits can include buffer memory in one buffer level including a first part and a second part, and data paths connecting the first part of the buffer memory alternately to the ECC circuits and to the I/O interface, and connecting the second part of the buffer memory alternately to the ECC circuits and to the I/O interface.

Also, the data path circuits can include multilevel buffer memory which, in addition to the page buffer having a page width (X), includes a second buffer level and a third buffer level. The third buffer level can include a first part and a second part, and data paths connecting the first part of the third buffer level alternately to the ECC circuits and to the I/O interface, and connecting the second part of the third buffer level alternately to the ECC circuits and the I/O interface. The first and second parts of the third buffer level can have a buffer width (Y) less than the page width (e.g. a multiple of the width of an ECC chunk), and the data path can have a bus width (Z) less than the buffer width for connecting the first and second parts of the third buffer level alternately to the ECC circuits and to the I/O interface.

A memory device is described herein, such as a page mode NAND flash including a page buffer, and an input/output interface for I/O data units having an I/O width less than the page width which supports fast continuous page read with divided ECC functions to improve throughput page read operations. The input/output interface can comprise a serial interface (e.g. SPI), or a parallel interface.

A technology is described in which a memory device includes a memory array including a plurality of bit lines, a page buffer coupled to the plurality of bit lines having a page width, and an input/output interface for I/O data units having an I/O width less than the page width. The memory device includes data path circuits connected between the page buffer and the interface, including a second buffer level and a third buffer level. A controller is responsive to commands received at the input/output interface, to control memory operations including a continuous page read operation to output a stream of pages at the I/O interface. The continuous read operation can include transferring a page of data having a page width X from the memory array to the page buffer in a page read interval, transferring a page of data from the page buffer to the second buffer level having a page width X, transferring a page of data from the second buffer level to the third buffer level and transferring the page of data from the third buffer level to the input/output interface on a data path having a bus width Z, where Z is less than X. The device includes ECC circuits connected to the data path circuits, which execute a first ECC functions on pages in the data path circuits, and a second ECC function during transfer of data in the stream of pages of the continuous read operation from the data path circuits to the input/output interface. In this example, the output rate at the input/output interface is limited by time required to perform the first ECC function. The second ECC function overlaps with the transfer of the page, and does not impact, or has a small impact on, the throughput.

Examples of the memory device are described in which the second buffer level is coupled to the page buffer by a data path for transfer of first and second parts of a page, and ECC bits from the page buffer to the second buffer level in one memory cycle use a transfer path that is at least one page and ECC bits wide. Also, the third buffer level can include first and second parts coupled to the second buffer level having a buffer width Y, where Y is less than X and greater than Z, for transfer of first and second parts of a page and ECC bits from the second buffer level to the third buffer level in one memory cycle by a first inter-buffer data path at least Y bits wide. In addition, a buffer data bus system is included operable to connect ECC circuits to each of the first and second parts of the third buffer level, for execution of the first ECC function such as syndrome calculation and key calculation, and to connect each of the first and second parts of the third buffer level via combinational logic for the second ECC function, such as Chien search, to the input/output interface, where the bus system has a bus width Z, where Z can be for some examples, one byte or four bytes. The first ECC function can include operating on data of width Z sequentially over data in a selected one of the first and second parts of the third buffer level, and the second ECC function can include modifying data of width Z in transit from the selected one of the first and second parts to the input/output interface.

Also, the memory device can include a second buffer level that includes first and second parts coupled to the page buffer by a buffer data path for transfer of a first part of the page and ECC bits from the page buffer to the first part in one memory cycle, and for transfer of a second part of a page and ECC bits from the page buffer to the second part of the second buffer level. The first and second parts of the second buffer level can have a buffer with Y. In embodiments described, the controller can use the second buffer level with the ECC circuits for the first ECC function in the continuous page read operation, and the third buffer level for the second ECC function.

Accordingly, for a fast continuous read operation, a three-level buffering system is described, in which the ECC circuits include an engine divided into 2 parts. The first part can execute a first ECC function, such as ECC calculation steps like syndrome and key calculation, and a second part can execute a second ECC function, such as error correction like Chien search. This execution of the second ECC function during data output can improve throughput relative to a system in which both ECC functions are executed over data stored in one of the buffer levels before data output.

Embodiments are described in which a memory array comprises a page mode NAND flash. The technologies described herein can be applied to other types of memory devices as well.

Other aspects and advantages of the present invention can be seen on review of the drawings, the detailed description and the claims, which follow.

DETAILED DESCRIPTION

A detailed description of embodiments of the present invention is provided with reference to the FIGS. 1-12.

Figure 1:
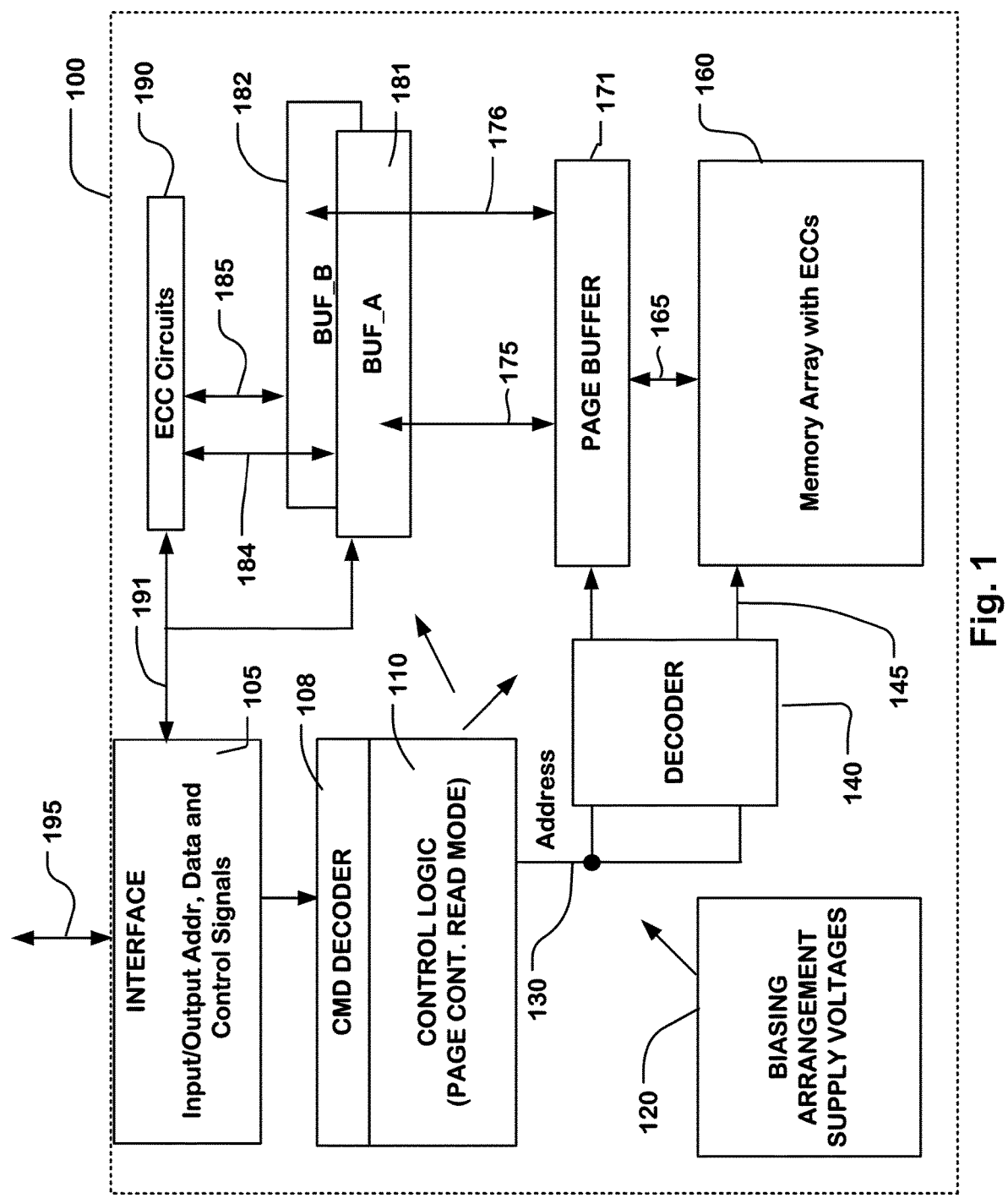
FIG. 1 is a simplified block diagram of an integrated circuit memory device supporting fast continuous page read as described herein.

FIG. 1 is a simplified chip block diagram of an integrated circuit memory device according to an embodiment. The integrated circuit memory device 100 includes a memory array 160 that stores data with ECCs, such as a NAND flash array, on a single integrated circuit substrate. Memory devices as described herein can be implemented using multichip modules, stacked chips and other configurations as well.

Control logic 110 with a command decoder 108, on the integrated circuit memory device 100 includes logic, such as a state machine, responsive to received commands to execute continuous read operations as described herein. The control logic 110 outputs control signals, represented by arrows on the diagram, and addresses on bus 130. The addresses applied on bus 130 can include for example outputs of an address counter in the control logic 110, or addresses carried in received commands.

A decoder 140 is coupled to a plurality of word lines 145, and arranged along rows in the memory array with ECCs 160, and to a page buffer 171. The page buffer 171 is coupled to a plurality of bit lines 165 arranged along columns in the memory array with ECCs 160 for reading data from and writing data to the memory array with ECCs 160.

The page buffer 171 can include one or more storage elements for each bit line. The address decoder 140 can select and couple specific memory cells in the memory array with ECCs 160 via respective connecting bit lines to the page buffer 171. The page buffer 171 can store data that is written to or read from these specific memory cells in parallel. The page buffer 171 can have a page width for pages including thousands of bits, such as 2K bits or 4K bits, or more, plus spare bits including associated ECC codes. One page can include a plurality of ECC chunks, wherein ECC chunks include a segment of data and an associated ECC code (i.e. having been computed for ECC over the segment of data). In embodiments, each page includes 2 ECC chunks having an ECC width equal to one half page, plus the size of the associated ECC codes. In some embodiments, there may be more than 2 ECC chunks per page.

A buffer memory structure in this embodiment includes a second buffer level, including two parts designated buffer BUF_A 181 and buffer BUF_B 182, in this example, where each part of the second buffer level can store a part, such as one half, of the contents of the page buffer, where the part of the contents of the page buffer preferably includes one or more ECC chunks. Also, each part of the second buffer level can be read from and written to independently. In some embodiments, the buffers BUF_A, BUF_B can be implemented using dual port or multi-port memory technology, allowing independent reads and writes to different addresses, or can be implemented using multiple banks of memory, having separate address decoding and read-out circuits. Other embodiments can include three-level buffer structures including the page buffer 171 and two additional buffer levels. Also, other arrangements of buffer memory structures in the data path circuits between the page buffer and the interface can be implemented.

The page buffer 171 is coupled with the memory array with ECCs 160 via X data lines where X is at least a page plus ECC codes width, and with the second-level buffers 181, 182 (BUF_A, BUF_B) of the buffer structure, via buses 175, 176 of Y bits each, where the buses 175, 176 can have a width equal to a half width of the page buffer 171. The second-level buffers BUF_A, BUF_B can each be implemented with a cache memory using SRAM (static random access memory) memory structures, for example, that has a one row by multiple column architecture. For instance, a page can include 2048 bits+spare bits including ECC codes, and BUF_A can have one row with 1024 (+spare bits including ECC codes) columns or a width of 1024+spare bits including ECC codes. The buffers BUF_A and BUF_B can be operated so that the page of data in the page buffer can be transferred to the buffers BUF_A and BUF_B in parallel, and in parallel using one buffer memory cycle. Also, the buffers BUF_A and BUF_B can be operated so that the one part of the page of data in the page buffer can be transferred to each one of the buffers BUF_A and BUF_B in parallel, allowing the transfer of a first part of the page to a first part (e.g. BUF_A) of the second buffer level, and the transfer of a second part of the page to a second part (e.g. BUF_A) of the second buffer level in the same or different buffer memory cycles.

Third-level buffers can also be implemented with a cache memory using SRAM (static random access memory) memory structures for example, that has a one row by multiple column architecture. For instance, a page can include 2048 bits+spare bits including ECC codes, and a third-level BUF_A can have one row with 1024 (+spare bits including ECC codes) columns or a width of 1024+spare bits including ECC codes. The third-level buffers BUF_A and BUF_B can be operated so that the page of data in the page buffer can be transferred to the a third-level buffers BUF_A and BUF_B in parallel, and in parallel using one buffer memory cycle. Also, the third-level buffers BUF_A and BUF_B can be operated so that the one part of the page of data in the second-level buffer can be transferred to each one of the third-level buffers BUF_A and BUF_B in parallel, allowing the transfer of a first part of the page to a first part of the third buffer level, and the transfer of a second part of the page to a second part of the third buffer level in the same or different buffer memory cycles.

Error checking and correction ECC circuits 190 are coupled to the buffer memory structure (181, 182 and three level embodiments) by data bus 184 and data bus 185. The data buses 184 and 185 can have a bus width less than an ECC chunk, such as one byte or one word, and are used by the ECC circuits 190 to cycle through ECC chunks to perform ECC operations of error checking and error correction (e.g. syndrome calculation, key calculation, Chien search). The ECC circuits are coupled by data bus 191 to the buffer memory structure (181, 182) for movement of data back and forth as necessary.

An I/O interface 105 which can include a byte-wide or multiple byte-wide transmit register or FIFO is coupled to the ECC circuits and to the buffer memory structure (181, 182) by data bus 191.

Input/output data and control signals are moved among the interface 105, the command decoder 108 and the control logic 110, and input/output ports 195 on the integrated circuit memory device 100 or other data sources internal or external to the integrated circuit memory device 100. In some embodiments, the ports 195 can connect to on-chip host circuits, such as a general purpose processor or special purpose application circuitry, or a combination of modules providing system-on-a-chip functionality supported by the memory array with ECCs 160.

In one embodiment, the interface 105 is a serial interface including a set of I/O ports 195 through which commands, addresses and data are communicated. The serial interface can be based on or compliant with a Serial Peripheral Interface (SPI) bus specification in which the command channel shares the I/O pins used by address and data. For example, the integrated circuit memory device 100 can include input/output ports using pins for receiving and transmitting SPI bus signals. One pin can be connected to an input data line carrying serial input data/address signal SI, usable for commands as well. Another pin, or multiple other pins, can be connected to an output data line or output data lines carrying serial output data signal SO. Another pin can be connected to a clock line carrying serial clock signal SCLK. Yet another pin can be connected to a control line carrying chip-enable or chip-select signal CS #. Other types of interfaces, including parallel interfaces can be used as well. The I/O ports 195 on a particular integrated circuit memory device 100 can be configured to provide output data with an I/O data width, which can be, for some examples, 1, 4, 8, 16, 32 or more bits in parallel per interface clock (e.g. SCLK) cycle. The I/O interface 105 can include a FIFO buffer, a shift register buffer or other supporting circuits along with a transmitter for transmitting data received at the interface on ports at a port clock rate, such as an SCLK rate for an SPI interface.

In the example shown in FIG. 1, control logic 110 using a bias arrangement state machine controls the application of a bias arrangement supply voltage generated or provided through the voltage supply or supplies in block 120, such as read, program and erase voltages including page read to transfer data from a page in the memory array to the page buffer. The control logic 110 is coupled to the multi-level buffer structure, the ECC circuits 190, and the memory array with ECCs 160.

The control logic 110 and command decoder 108 constitute a controller which can be implemented using special purpose logic circuitry including state machines and supporting logic. In alternative embodiments, the control logic comprises a general-purpose processor, which can be implemented on the same integrated circuit, which executes a computer program to control the operations of the device. In yet other embodiments, a combination of special-purpose logic circuitry and a general purpose processor can be utilized for implementation of the control logic.

The command decoder 108 and control logic 110 of the controller are configured to execute a continuous read operation. In embodiments described herein, the controller is responsive to the commands received at the input/output interface, to control memory operations including a continuous page read operation to output a stream of pages at the I/O interface.

Figure 2:
FIG. 2 is a diagram of a command sequence for continuous read as described herein.

FIG. 2 is a diagram showing a continuous read operation using the cache read command format. In this operation, the continuous read is initiated by a first command C1 for a page read of page X. After a read latency tR, a cache read command C2 is issued and the data for the pages is output continuously thereafter. Page X is output in this example immediately after the cache read command C2 is received. The next pages, X+1, X+2 and so on are output sequentially without wait states in preferred systems. In some embodiments, the continuous read terminates when a chip select signal, for example, is switched from low to high.

Figure 3:
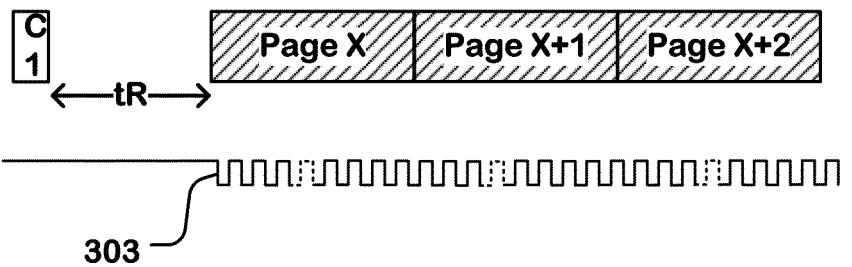
FIG. 3 is a diagram of an alternative command sequence continuous read as described herein.

FIG. 3 is a diagram showing an alternative continuous read operation, in which the read clock is used to initiate data output. This sequence begins with a continuous read command C1 identifying a starting page address, page X. The read clock 303 begins toggling after the read latency tR, and data of the pages X, X+1, X+2 and so on are output continuously as long as the read clock 303 toggles.

The read latency for continuous read can be limited by the duration of the page read transfer from the array to the page buffer, and by the duration of the ECC operation. The duration of the page read transfer from the array to the page buffer can be a function of the array architecture. The duration of the ECC operations can depend on page size. So at a particular page size, and for a given ECC operation, there is a page size at which the duration of the ECC operations is longer than the duration of the page read transfer from the array to the page buffer. So for a larger page size, the ECC performance may determine continuous read throughput performance. For a smaller page size, the page read transfer from the array to the page buffer may determine continuous read throughput performance.

Figure 4:
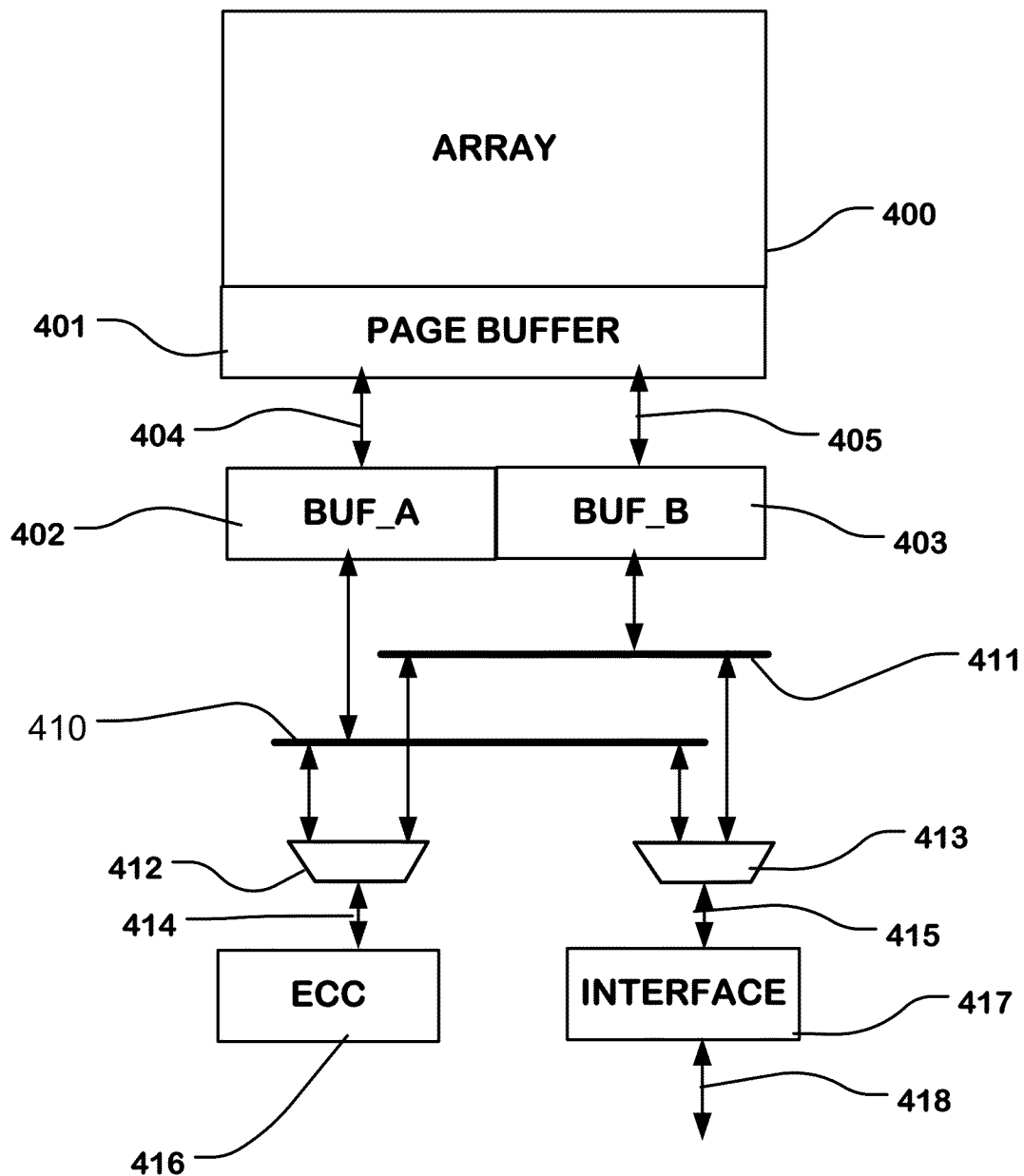
FIG. 4 is a block diagram showing two-level buffering for a device supporting continuous read as described herein, with ECC.

FIG. 4 is a block diagram illustrating a memory array and data path circuitry including ECC circuits operable for page continuous read with two-level buffering (page buffer/buffer BUF_A, buffer BUF_B). This is one example of a circuit organization that can be utilized for example in the integrated circuit memory device 100 shown in FIG. 1.

In FIG. 4, a memory array 400, such as a NAND flash array, is coupled to a page buffer 401. Data can move from the memory array 400 to the page buffer 401 in parallel during a single page read operation. The page buffer 401 is coupled to the data path circuits including buffer BUF_A 402, and buffer BUF_B 403 by bus 404 and bus 405, respectively. The bus 404 can have a data width that is half the width+ECCs of the page buffer 401, for transfer of one half of a page from the page buffer 401 to buffer BUF_A in a single cycle. Likewise, the bus 405 can have a data width that is half the width of the page buffer 401, for transfer of one half of the page from the page buffer 401 to buffer BUF_B in a single cycle. ECC bits can be included in the BUF_A and buffer BUF_B, or additional memory elements can be used for ECC bits in parallel with BUF_A and buffer BUF_B.

Buffer BUF_A and buffer BUF_B are in advantageous embodiments configured to hold at least one ECC chunk, including the data and ECC code associated with the data so that it can be operated on by ECC circuits 416 independently of data in the other buffer.

As illustrated, the data path circuits include a bus 410 connected to buffer BUF_A, and a bus 411 connected to buffer BUF_B. The bus 410 connected to a multiplexer 412 and to a multiplexer 413. Likewise, the bus 411 is connected to the multiplexer 412 and to the multiplexer 413. The output of the multiplexer 412 is connected by line 414 to the ECC circuits 416. The output of the multiplexer 413 is connected by line 415 to the I/O interface 417, which provides the output data for the addressed pages. Data can be moved on the bus 410 and the bus 411 by addressable units such as bytes or words that are supportable by the buses 410, 411, for use by the ECC circuits 416 and for output by the interface 417 on I/O ports 418.

Figure 5:
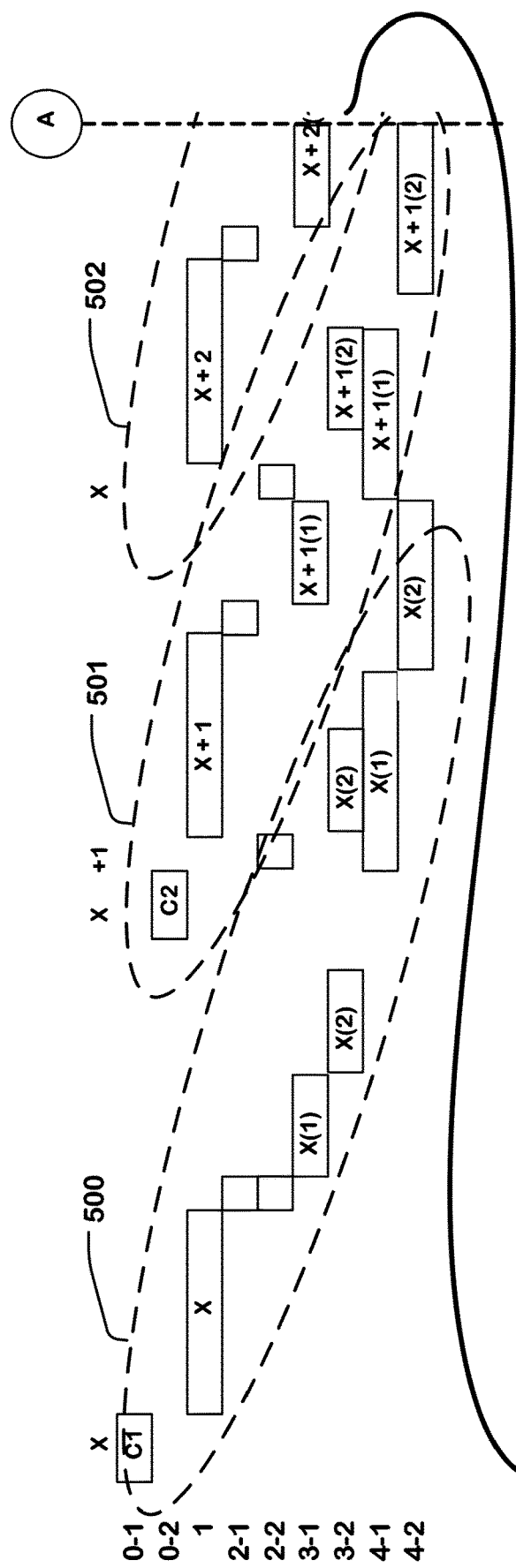
FIG. 5 is a pipeline dataflow diagram for one embodiment of a page continuous read as described herein with two-level buffering.
Figure 5:
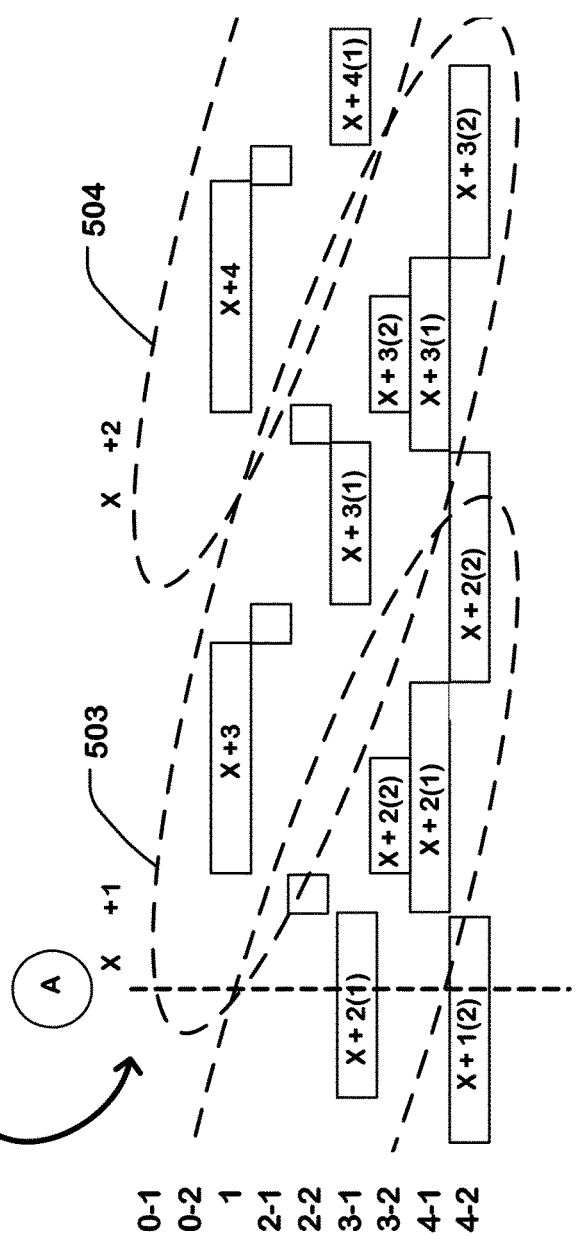

FIG. 5 is a diagram that illustrates the data flow for a page continuous read like that of FIG. 2 utilizing data path circuitry having two buffer levels (page buffer/buffer BUF_A, buffer BUF_B) like that of FIG. 4. In the diagram, the horizontal axis represents time, each vertical level corresponds to a particular data movement as follows:

0-1: receive page read command C1 for a new page.
0-2: receive read from cache intra-stream command C2 to read the data.
1: move the page data and ECCs from the memory array to the page buffer (both halves).
2-1: move the data from the first half of the page buffer to buffer BUF_A.
2-2 move the data from the second half of the page buffer to buffer BUF_B.
3-1: apply ECC logic for error detection and correction in buffer BUF_A.
3-2: apply ECC logic for error detection and correction in buffer BUF_B.
4-1: move the data from buffer BUF_A to the data path in the I/O interface.
4-2: move the data from buffer BUF_B to the data path in the I/O interface.

The end of sequence command is not illustrated in FIG. 5. It can be implemented as discussed above.

In FIG. 5, a first command C1 is received at the beginning at level 0-1 providing the beginning address of page X. Proceeding diagonally down to level 4-2 as indicated by the elements within region 500 for page X, the data of page X is loaded into the page buffer at level 1. From the page buffer, a first half of the page is loaded into buffer BUF_A at level 2-1. Also, at a later time (or simultaneously) a second half of the page is loaded into buffer BUF_B at level 2-2. At level 3-1, while the first half of page X is in buffer BUF_A, ECC circuitry is exercised over the ECC chunk or chunks in the first half of the page. Later, at level 3-2, while the second half of page X is in buffer BUF_B, the ECC is exercised over the ECC chunk or chunks in the second half of the page. Finally at level 4-1, the first half of page X is provided to the I/O interface to be provided as output when the cache read command C2 is received at level 0-2. At level 4-2, the second half of page is provided to the I/O interface continuous with the first half.

As described herein, the intra-stream command C2 (read from cache) can carry an address of a next page in the continuous read sequence. A sequence of continuous reads (regions 501, 502, 503, 504 . . . ) can be executed in this sequence, responding to a series of commands to output a stream of pages.

The procedure shown in FIG. 5 is an example of the controller responding to a series of commands to output a stream of pages. The controller responds to the first command to initiate a continuous page read operation, to transfer a first addressed page in the stream from the memory array to the page buffer, and move the first addressed page through the data path circuits to the interface. The controller responds to a first intra-stream command received after a read latency to enable output of the first addressed page from the interface in I/O data units.

Figure 6:
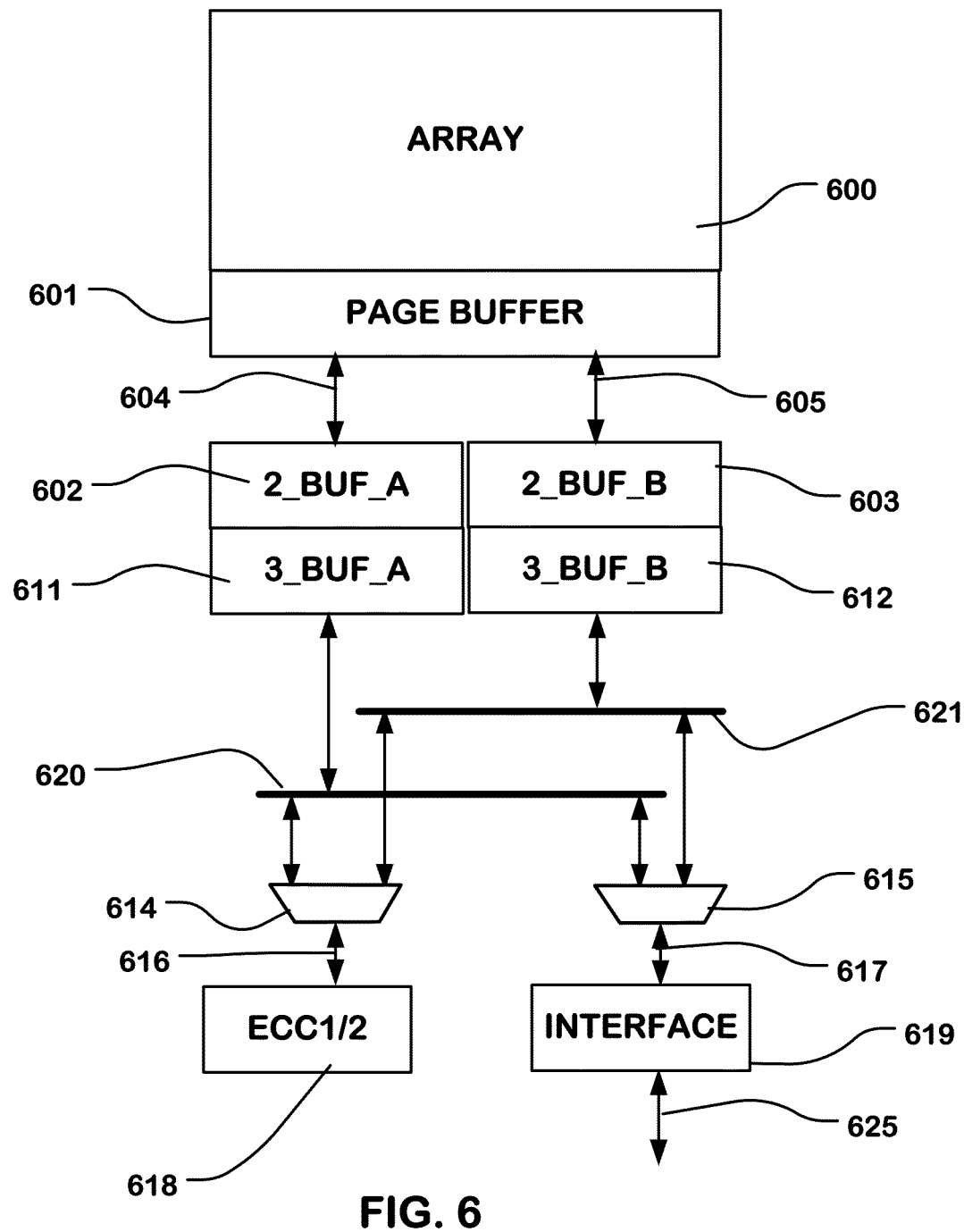
FIG. 6 is a block diagram showing three-level buffering for a device supporting continuous read as described herein with ECC.

FIG. 6 is a block diagram illustrating a memory array, and data path circuitry including ECC circuits operable for page continuous reads as described herein with three-level buffering (page buffer/buffer 2_BUF_A, buffer 2_BUF_B/buffer 3_BUF_A, buffer 3_BUF_B). This is another example of a circuit organization that can be utilized for example in integrated circuit memory device 100 of FIG. 1. The second and third buffer levels can be implemented using SRAM and cache technologies as discussed above in connection with FIG. 1.

The throughput can be enhanced using three-level buffering like that of FIG. 6, in the case in which the duration of the page read transfer from the array to the page buffer dominates continuous read performance, by using the second-level buffer to clear the page buffer in advance of completion of the ECC operation. This can be accomplished by loading the page buffer from the array, and then moving the data to the second-level buffer. This clears the page buffer so that it can be used for the next page read operation while the previous page is moved through the data path circuits to the interface, and ECC operations are executed. Also, for the case in which the duration of the ECC operation dominates continuous read performance, throughput can be enhanced by dividing the ECC operation into two ECC functions, and executing the two functions during different stages of the move of the page through data path circuits.

In FIG. 6, a memory array 600, such as a NAND flash array, is coupled to a page buffer 601. Data can move from the memory array 600 to the page buffer 601 in parallel during a single read operation. The page buffer 601 is coupled to the data path circuits including second-level buffer, including buffer 2_BUF_A (602) and buffer 2_BUF_B (603), by bus 604 and bus 605. The bus 604 can have a data width that is half the width of a page buffer 601 (including ECC bits), for transfer of one half of the page from the page buffer 601 to buffer 2_BUF_A in a single cycle. Likewise, the bus 605 can have a data width that is half the width of the page buffer 601, for transfer of one half of the page from page buffer 601 to buffer 2_BUF_B in a single cycle.

The second-level buffer, buffer 2_BUF_A, is coupled to the third-level buffer, buffer 3_BUF_A (611), by a data path that can have the same width (i.e. one half of the page) as bus 604 enabling transfer of data from buffer 2_BUF_A to buffer 3_BUF_A in a single buffer memory cycle. Likewise, buffer 2_BUF_B is coupled to buffer 3_BUF_B (612) by a data path that can have the same width (i.e. one half of the page) as bus 605, enabling transfer of data from buffer 2_BUF_B to buffer 3_BUF_B in one buffer memory cycle. In some embodiments, the second-level buffer can have the same width as the page buffer, and may include a single buffer structure rather than a divided structure as illustrated here.

As illustrated, the data path circuits include a bus 620 connected to buffer 3_BUF_A, and a bus 621 connected to buffer 3_BUF_B. The bus 620 is connected to a multiplexer 614 and to a multiplexer 615. Likewise, the bus 621 is connected to the multiplexer 614 and to the multiplexer 615. The output of the multiplexer 614 is connected by line 616 to the ECC circuits 618. The output of the multiplexer 615 is connected by line 617 to the I/O interface 619, which provides the output data for the addressed pages on ports 625. Data can be moved on the bus 620 and the bus 621 by addressable units such as bytes or words that are supportable by the buses 620, 621, for use by the ECC circuits 618 and for output by the interface 619 on ports 625. The ECC circuit 618 can include first ECC function circuits, and second ECC function circuits which can be utilized alternatively using the buffer 2_BUF_A/buffer 2_BUF_B, buffer 3_BUF_A/ buffer 3_BUF_B structures. In some embodiments, the bus 620 and the bus 621 can be coupled to both the second and third buffer levels, including the buffer 2_BUF_A/buffer 2_BUF_B, and the buffer 3_BUF_A/buffer 3_BUF_B structures. The ECC operation can include a first ECC function executed on pages held in one of the second level buffer and the third level buffer of the data path circuits, and a second ECC function executed on pages held in one of the second level buffer and the third level buffer of the data path circuits.

Figure 7:
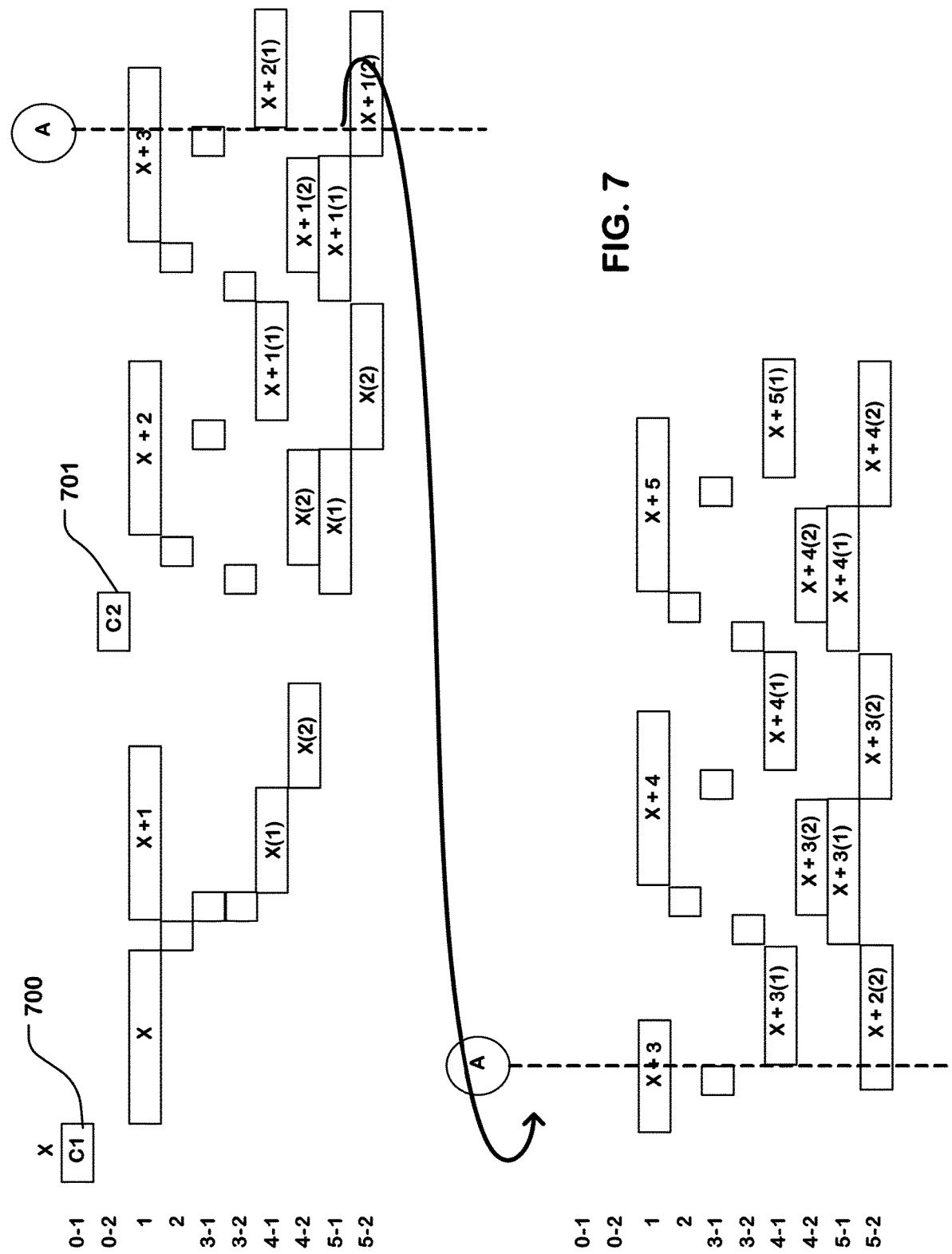
FIG. 7 is a pipeline dataflow diagram for one embodiment of a page continuous read as described herein with three-level buffering.

FIG. 7 is a diagram that illustrates the data flow for a page continuous read utilizing data path circuitry having three buffer levels (page buffer/buffer 2_BUF_A, buffer 2_BUF_B/buffer 3_BUF_A, buffer 3_BUF_B) like that of FIG. 6. In the diagram, the horizontal axis represents time, each vertical level corresponds to a particular data movement as follows:

0-1: receive first page read command C1 for a first page.
0-2: receive first intra-stream page read command C2 for a second page.
1: move the page data and ECCs from the memory array to the page buffer (both halves).
2: move the page data from the page buffer to buffer 2_BUF_A and buffer 2_BUF_B.
3-1: move the data from the first half of the page in buffer 2_BUF_A to buffer 3_BUF_A.
3-2: move the data from the second half of the page in buffer 2_BUF_B to buffer 3_BUF_B.
4-1: apply ECC logic for error detection and correction in buffer 3_BUF_A.
4-2: apply ECC logic for error detection and correction in buffer 3_BUF_B.
5-1: move the data from buffer 3_BUF_A to the data path in the I/O interface.
5-2: move the data from buffer 3_BUF_B to the data path in the I/O interface.

The end of sequence command is not illustrated in FIG. 7. It can be implemented as discussed above.

In FIG. 7, a first continuous read command C1 is received in interval 700 at the level 0-1 identifying a first page, page X, for the sequence. Proceeding diagonally down to level 5-2 for page X, the data of page X is loaded into the page buffer at level 1. From the page buffer, the data of page X is loaded into the first buffer level, including buffer 2_BUF_A and buffer 2_BUF_B in a single transfer at level 2 of the figure in this embodiment before data from the next page X+1 is loaded to the page buffer. After the data of page X is moved out of the page buffer, into the data path circuits, the data of page X+1 is moved into the page buffer.

Subsequently, at level 3-1, the data from buffer 2_BUF_A is transferred to buffer 3_BUF_A in the second buffer level. Thereafter, or simultaneously, at level 3-2, the data from buffer 2_BUF_B is transferred to buffer 3_BUF_B in the third buffer level.

In level 4-1, the ECC circuitry operates on the ECC chunks of page X in buffer 3_BUF_A. At level 4-2, the ECC circuitry operates on the ECC chunks of page X in buffer 3_BUF_B.

Thereafter at level 5-1, the data of page X in buffer 3_BUF_A is available at the interface.

At level 5-2, the data of page X in buffer 3_BUF_B is available at the interface.

After the first continuous read command C1 in interval 700, a second continuous read command C2 is received in interval 701 after tR, while the data of page X is output (level 5-1) at the interface aligned with C2.

As illustrated in FIG. 7, the data of page X+1 traverses the data path circuits so it is available after operation of the ECC circuits at the I/O interface in a manner that is contiguous with the end of page X. The procedure continues in a pipelined manner through the data path circuits as illustrated in FIG. 7 until the continuous read operation is terminated.

Figure 8:
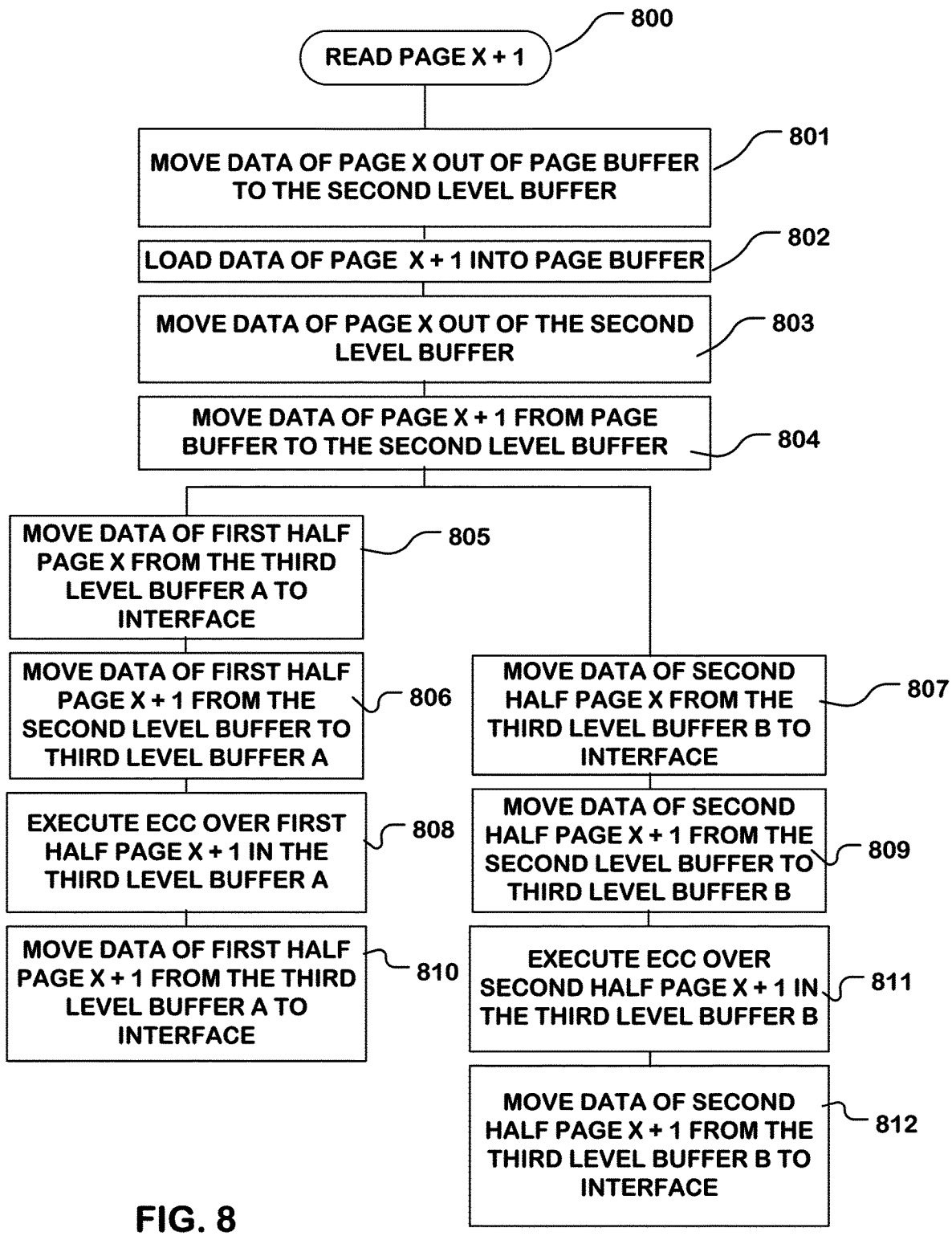
FIG. 8 is a flowchart illustrating a continuous page read operation as described herein for a system including three-level buffering.

FIG. 8 is a flowchart illustrating the stages for reading a page in a continuous read operation, including a continuous read with non-sequential pages or a continuous read with only sequential pages. For the purposes of FIG. 8, a current page is designated as page X+1. A preceding page is designated as page X so that it can align with the flow shown in FIG. 8. This flow can also be applied to any page in the stream of pages of a continuous page read, except the first page where the flow can execute without necessarily clearing the data path of a previous page.

FIG. 8 begins with a command initiating a read of current page X+1 (800). The procedure begins with first moving the data of the preceding page, page X, out of the page buffer to the second-level buffer (801). Then the data of the current page X+1 is loaded into the page buffer in a memory read operation (802). Next in the flow, the data of the preceding page, page X, is moved out of the second-level buffer (803). Then the data of the current page, page X+1, is moved from the page buffer to the second-level buffer (804). Using an architecture like that of FIG. 6, the move from the page buffer to the second-level buffer can be executed in two parts, to two separately accessible parts of the second-level buffer 2_BUF_A and 2_BUF_B.

Before moving the data of the current page out of the second-level buffer, the process involves moving the data of the first half of the preceding page X from the third-level buffer to the interface (805). Then, data of the first part of the current page X+1 can be moved from the second-level buffer to the third-level buffer (806). Using an architecture like that of FIG. 6, the move from the second-level buffer to the third-level buffer can be executed in two parts, to two separately accessible parts of the third-level buffer 3_BUF_A and 3_BUF_B. While the first part of the current page X+1 is in the third-level buffer, the ECC function can be executed over the first part of the current page X+1 (808). The ECC operation can include multiple steps, executed in a byte-by-byte operation, or using data units equal to the bus width. In one example, using a Bose-Chaudhuri-Hocquenghem (BCH) format, the ECC operation includes syndrome calculation, key calculation, and Chien search.

In a manner that can overlap in time with moving the first part of the current page X+1 to the third-level buffer in step 806 or with execution of the ECC function, the data from the second half of the preceding page X can be moved from the third-level buffer to the interface (807). This operation of moving data from the third-level buffer to the interface can be a byte-by-byte operation, or an operation that is executed using data units equal to the bus width. Then the data of the second half of the current page X+1 can be moved from the second-level buffer to the third-level buffer (809). While the second part of the current page X+1 is in the third-level buffer, the ECC function can be executed over the second part of the current page (811).

In a manner that can overlap in time with executing the ECC function over the second half of the current page X+1, the data from the first half of the current page X+1 can be moved from the third buffer level to the interface (810). Again, this operation of moving data from the third-level buffer to the interface can be a byte-by-byte operation, or an operation that is executed using data units equal to the bus width.

After the first part of the current page is moved to the interface, the second part of the current page X+1 can be moved to the interface to complete the read of the current page (812).

The procedure shown in FIG. 8 can be considered a pipeline operation including four stages moving the page across four memory levels, including the page buffer, the second-level buffer, the third-level buffer, and a transmit register or FIFO in the interface. In a pipelined fashion, the stages can be used to increase the throughput of the read operation by overlapping operations on the sequences of pages. The throughput in the pipeline example, is limited by the duration of the longest of the stages in the pipeline. Thus, in some implementations the throughput as determined by the output rate at the input/output interface is limited by a time required to move the page from the second buffer level to the third buffer level and perform the first ECC function in the third buffer level. The clock rate of the input/output interface to maintain this throughput need only be sufficient to output each page within the duration of the longest of the stages in the pipeline. Higher clock rates would require a host to introduce wait states between pages.

The procedure shown in FIG. 8 can represent the logic in a controller on an integrated circuit memory device, such as that shown in FIG. 1 including a three-level buffer structure like that of FIG. 6.

Figure 9:
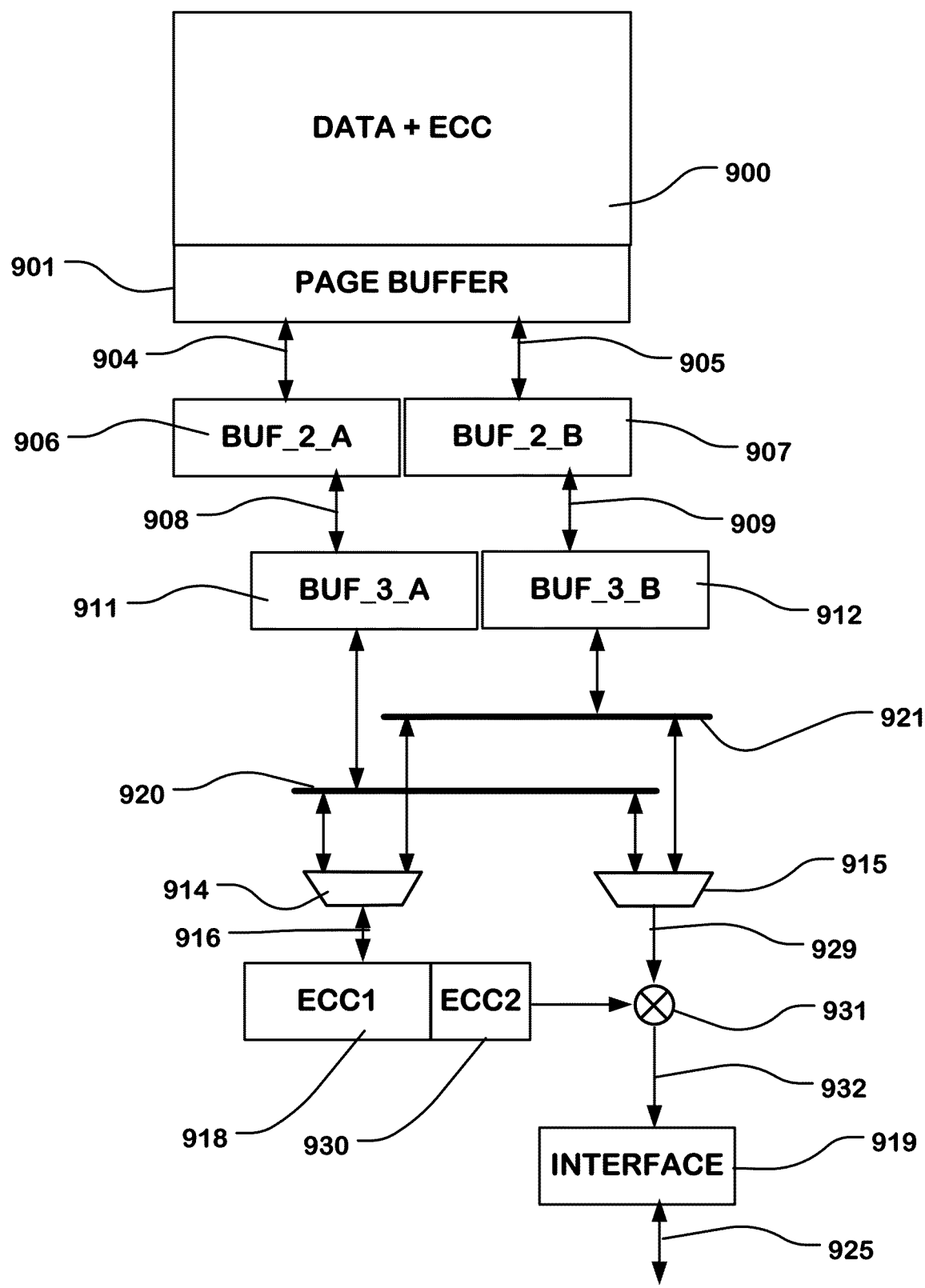
FIG. 9 is a block diagram showing three-level buffering for a device supporting fast page continuous read operations with divided ECC functions.

FIG. 9 is a block diagram illustrating a memory array, and data path circuitry including ECC circuits operable for fast continuous read operations, including sequential and non-sequential reads, with three-level buffering (page buffer/ buffer 2_BUF_A, buffer 2_BUF_B/buffer 3_BUF_A, buffer 3_BUF_B). This is another example of a circuit organization that can be utilized for example in integrated circuit memory device 100 of FIG. 1. The second and third buffer levels can be implemented using SRAM and cache technologies as discussed above in connection with FIG. 1.

In FIG. 9, a memory array 900, such as a NAND flash array, is coupled to a page buffer 901. Data can move from the memory array 900 to the page buffer 901 in parallel during a single read operation. The page buffer 901 is coupled to the data path circuits, including a second-level buffer having first and second parts, in this example, including buffer 2_BUF_A (906) and buffer 2_BUF_B (907), by bus 904 and bus 905. The bus 904 can have a data width that is half the width of a page buffer 901, for transfer of one half of the page plus ECC bits from the page buffer 901 to buffer 2_BUF_A in a single cycle. Likewise, the bus 905 can have a data width that is half the width of the page buffer 901, for transfer of one half of the page plus ECC bits from page buffer 901 to buffer 2_BUF_B in a single cycle. In some embodiments, the second-level buffer can have the same width as the page buffer, and may include a single buffer structure rather than a divided structure as illustrated here. Also, embodiments of the second buffer level can include more than two parts.

The second-level buffer, buffer 2_BUF_A, is coupled to the third-level buffer, including two parts in this example, buffer 3_BUF_A, buffer 3_BUF_B. In this example, buffer 3_BUF_A (911), by a data path 908 that can have the same width (i.e. one half of the page) as bus 904, enables transfer of data from buffer 2_BUF_A to buffer 3_BUF_A in a single cycle. Likewise, buffer 2_BUF_B is coupled to buffer 3_BUF_B (912) by a data path 909 that can have the same width (i.e. one half of the page) as bus 905, enabling transfer of data from buffer 2_BUF_B to buffer 3_BUF_B in one cycle. Also, embodiments of the third buffer level can include more than two parts.

As illustrated, the data path circuits include a bus 920 connected to buffer 3_BUF_A, and a bus 921 connected to buffer 3_BUF_B. The bus 920 is connected to a multiplexer 914 and to a multiplexer 915. Likewise, the bus 921 is connected to the multiplexer 914 and to the multiplexer 915. Data can be moved on the bus 920 and the bus 921 by bus width Z addressable units such as bytes or words that are supportable by the buses 920, 921, for use by the ECC circuits 918 and 930, for output by the interface 919 on ports 925.

The output of the multiplexer 914 is connected by line 916 to the ECC circuits including circuits 918 for a first ECC function ECC1, such as syndrome calculation and key calculation and for a second ECC function ECC2, such as Chien search.

The buffer data bus system operable to connect the ECC circuits to each of the first and second parts of the third buffer level for execution of the first ECC function, and to connect each of the first and second parts of the third buffer level (via combinational logic) for the second ECC function to the input/output interface has a bus system having the bus width Z in this example. The first ECC function includes operating on data of width Z sequentially over data in selected one of the first and second parts of the third buffer level, and the second ECC function includes modifying data of width Z in transit from a selected one of the first and second parts of the third buffer level to the input/output interface in the illustrated example.

The output of the multiplexer 915 is connected by line 929 to combinational logic 931, having an output is connected by line 932 to the I/O interface 919. A second input to the combinational logic 931 includes error correction data from the second ECC function ECC2 in circuits 930. The combinational logic can comprise logic gates such as XOR gates that combine the data on bus 921 with error correction data to provide error corrected data on line 932. Use of combinational logic does not require an additional register stage, and can operate within the timing delay allowed by the clock rate of the transfer path.

The I/O interface 919 can include register of FIFO to accept data from the line 932, and provide the output data for the addressed pages on ports 925 of the device.

Figure 10:
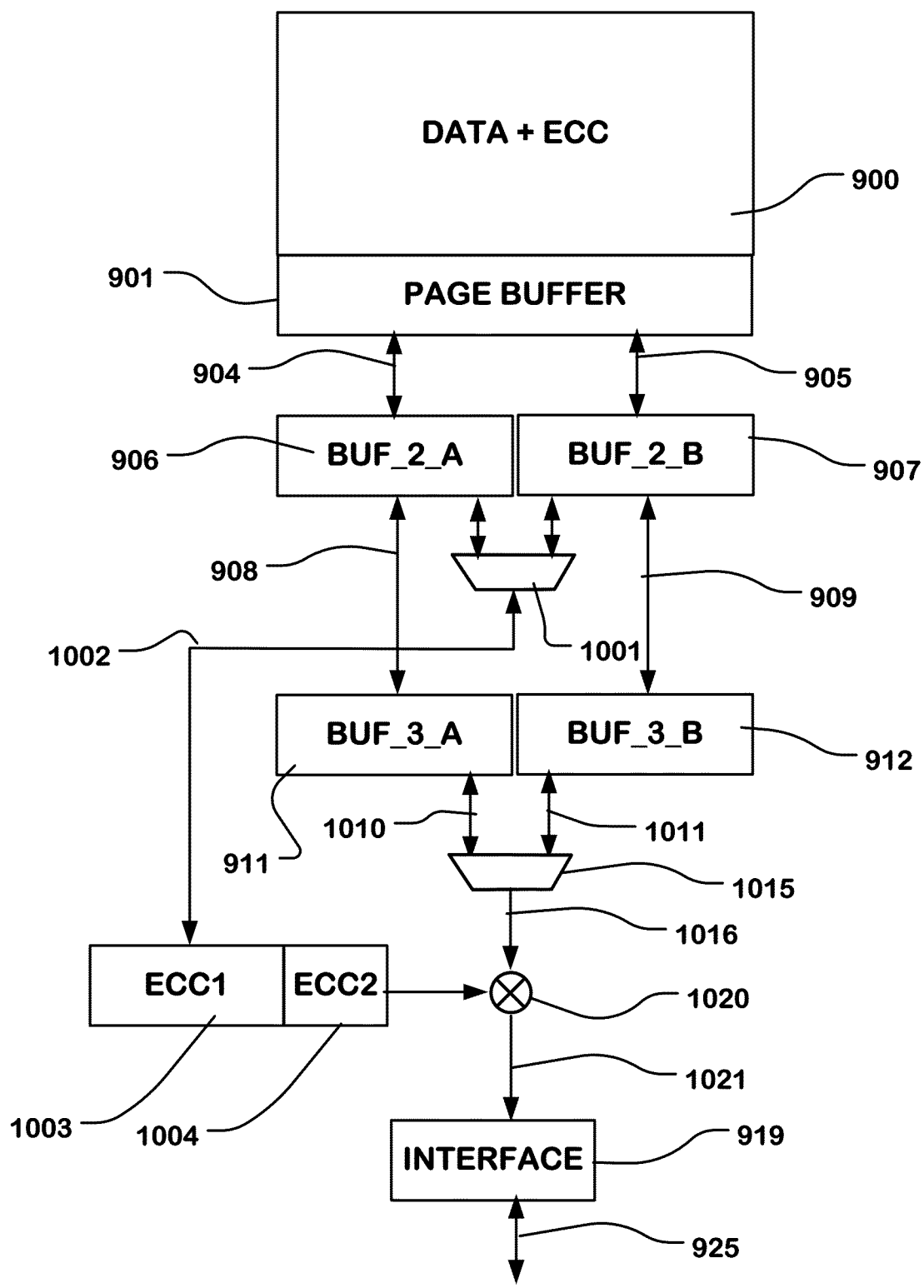
FIG. 10 is a block diagram showing three-level buffering for a device supporting fast page continuous read operations, with divided ECC functions, for an alternative embodiment.

FIG. 10 is a block diagram illustrating a memory array, and data path circuitry including ECC circuits operable for fast continuous read operations with three-level buffering (page buffer/buffer 2_BUF_A, buffer 2_BUF_B/buffer 3_BUF_A, buffer 3_BUF_B). This is another example of a circuit organization that can be utilized for example in integrated circuit memory device 100 of FIG. 1.

In FIG. 10, components which are the same, for the purposes of this description, as corresponding components in FIG. 9 have the same reference numerals and are not described again.

In the embodiment shown in FIG. 10, the first and second parts 906, 907 of the second-level buffer 2_BUF_A/buffer 2_BUF_B are connected to multiplexer 1001, the output of which is connected by line 1002 to the first ECC function circuits 1003. Also, the first and second parts 911, 912 of the third-level buffer 3_BUF_A/buffer 3_BUF_B are connected to multiplexer 1015 by lines 1010 and 1011, respectively, the output of which is provided on line 1016 to the combinational logic 1020, the output of which is connected by line 1021 to the interface 919.

The ECC circuit includes first ECC function circuits 1003, and second ECC function circuits 1004. The first ECC function circuits 1003 can be utilized alternatively using the buffer 2_BUF_A/buffer 2_BUF_B under the control of a state machine or other control logic in a controller on the device to produce correction data. The second ECC function circuits 1004 are coupled to the combinational logic 1020 to provide the correction data for combination with the corresponding page in transit to the interface from the corresponding part of the third-level buffer. Using a structure like that of FIG. 10, the ECC operation can be split, using the second-level buffer for a first part of the operation, and the third-level buffer for the final part of the operation.

Figure 11:
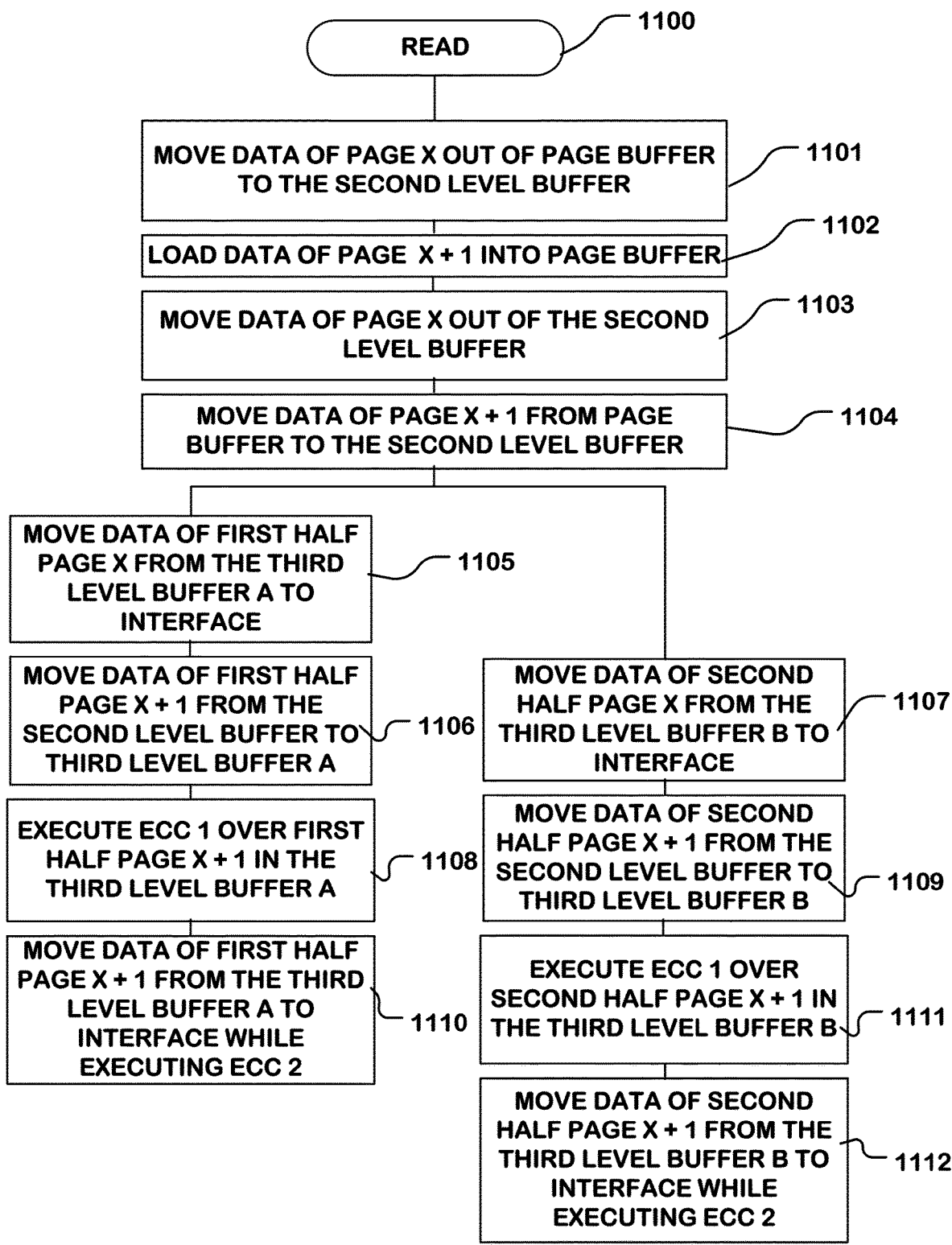
FIG. 11 is a flowchart illustrating fast continuous page read operations for a system including three-level buffering like that of FIG. 9 or FIG. 10.

FIG. 11 is a flowchart illustrating the stages for reading a page in a continuous read operation. For the purposes of FIG. 11, a current page is designated as page X+1. A preceding page is designated as page X so that it can align with the flow shown in FIG. 7. This flow can also be applied to any page in the stream of pages of a continuous page read, except the first page where the flow can execute without necessarily clearing the data path of a previous page.

FIG. 11 begins with a command inducing read of current page X+1 (1100). The procedure begins with first moving the data of the preceding page, page X, out of the page buffer to the second-level buffer (1101). Then the data of the current page X+1 is loaded into the page buffer in a memory read operation (1102). Next in the flow, the data of the preceding page, page X, is moved out of the second-level buffer (1103). Then the data of the current page, page X+1, is moved from the page buffer to the second-level buffer (1104). Using an architecture like that of FIG. 9 or FIG. 10, the move from the page buffer to the second-level buffer can be executed in two parts, to two separately accessible parts of the second-level buffer 2_BUF_A and 2_BUF_B.

Before moving the data of the current page out of the second-level buffer, the process involves moving the data of the first half of the preceding page X from the third-level buffer to the interface (1105). Then, data of the first part of the current page X+1 can be moved from the second-level buffer to the third-level buffer (1106). Using an architecture like that of FIG. 9 or FIG. 10, the move from the second-level buffer to the third-level buffer can be executed in two parts, to two separately accessible parts of the third-level buffer 3_BUF_A and 3_BUF_B. While the first part of the current page is in the third-level buffer, a first ECC function (ECC1 as discussed above) can be executed over the first part of the current page (1108). The ECC operation can include multiple steps, executed in a byte-by-byte operation, or using data units equal to the bus width. In one example, using a Bose-Chaudhuri-Hocquenghem (BCH) format, the first ECC function includes syndrome calculation and key calculation.

In a manner that can overlap in time with moving the first part of the current page to the third-level buffer in step 1106 or with execution of the first ECC function, the data from the second half of the preceding page X can be moved from the third-level buffer to the interface via combinational logic to perform the second ECC function (1107). This operation of moving data from the third-level buffer to the interface can be a byte-by-byte operation, or an operation that is executed using data units equal to the bus width. Then the data of the second half of the current page X+1 can be moved from the second-level buffer to the third-level buffer (1109). While the second part of the current page X+1 is in the third-level buffer, the first ECC function can be executed over the second part of the current page (1111).

In a manner that can overlap in time with executing the first ECC function over the second half of the current page, the data from the first half of the current page can be moved from the third buffer level to the interface via combinational logic to perform the second ECC function (1110). The second ECC function can be a Chien search in the BCH example. Again, this operation of moving data from the third-level buffer to the interface can be a byte-by-byte operation, or an operation that is executed using data units equal to the bus width.

After the first part of the current page is moved to the interface while being processed by the second ECC function, the second part of the current page can be moved to the interface via combinational logic to perform the second ECC function, to complete the read of the current page (1112).

The procedure shown in FIG. 11 can be considered a pipeline operation including four stages moving the page across four memory levels, including the page buffer, the second-level buffer, the third-level buffer, and a transmit register or FIFO in the interface. In a pipelined fashion, the stages can be used to increase the throughput of the read operation by overlapping operations on sequential pages. The throughput, in the pipeline example, is limited by the duration of the longest of the stages in the pipeline. In this case, the longest stage can be the stage involving moving the data from the second buffer level to the third buffer level, and performing the first ECC function over the data in the third buffer level. Thus, the clock rate for continuous page read in this example can be faster than for the example of FIG. 8.

Figure 12:
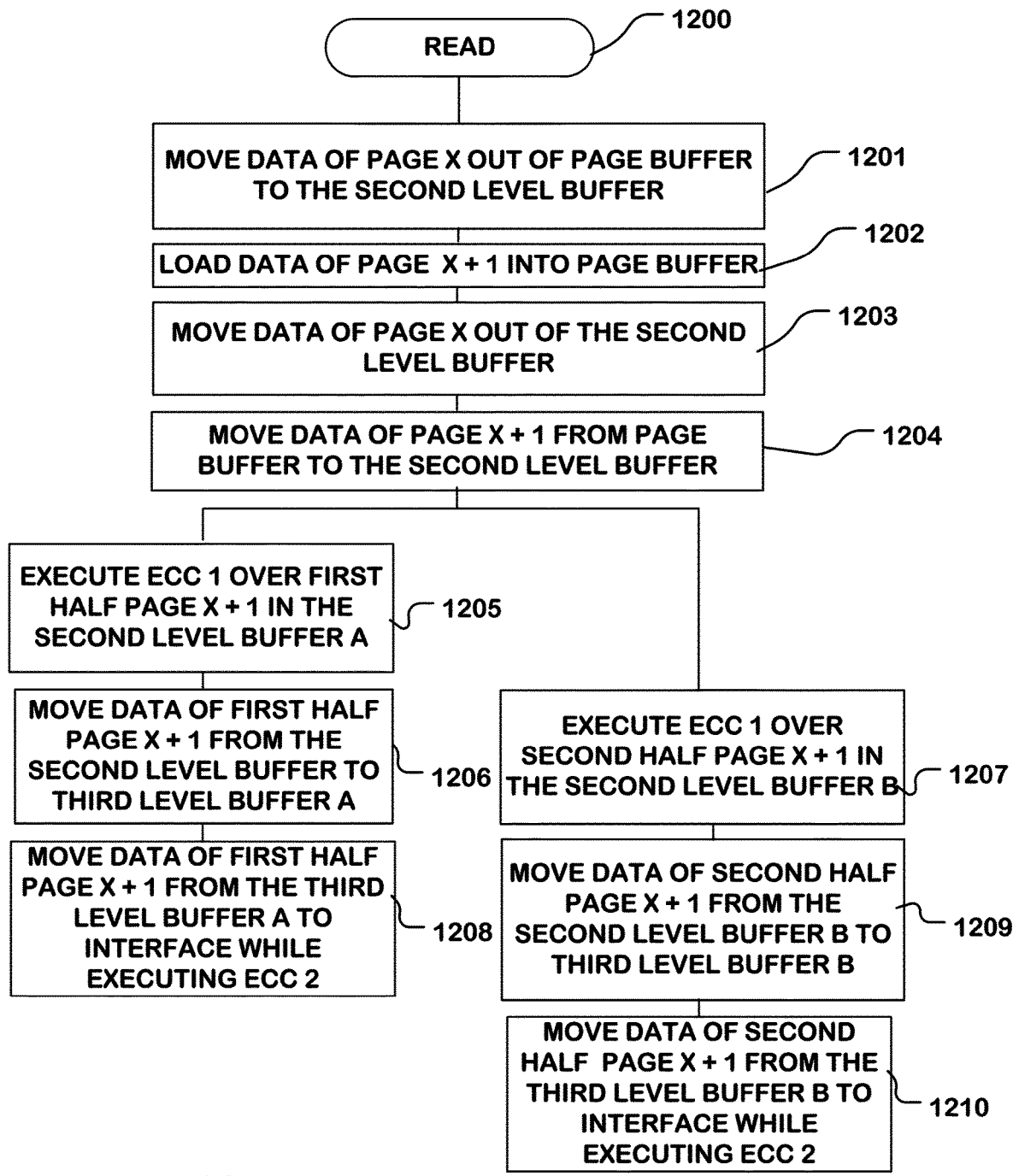
FIG. 12 is a flowchart illustrating a page read operation for a system including three-level buffering like that of FIG. 9 or FIG. 10 for an alternative using the second-level buffer for a first ECC function.

FIG. 12 is a flowchart illustrating the stages for reading a page in a continuous read operation. For the purposes of FIG. 12, a current page is designated as page X+1. A preceding page is designated as page X so that it can align with the flow shown in FIG. 8. This flow can also be applied to any page in the stream of pages of a continuous page read.

FIG. 12 with a command inducing read of current page X+1 (1200). The procedure begins with first moving the data of the preceding page, page X, out of the page buffer to the second-level buffer (1201). Then, the data of the current page X+1 is loaded into the page buffer in a memory read operation (1202). Next in the flow, the data of the preceding page, page X, is moved out of the second-level buffer (1203). Then, the data of the current page, page X+1, is moved from the page buffer to the second-level buffer (1204). Using an architecture like that of FIG. 10, the move from the page buffer to the second-level buffer can be executed in two parts, to two separately accessible parts of the second-level buffer 2_BUF_A and 2_BUF_B.

While the first part of the current page is in the second-level buffer, a first ECC function (ECC1 as discussed above) can be executed over the first part of the current page (1205). The ECC operation can include multiple steps, executed in a byte-by-byte operation, or using data units equal to the bus width. In one example, using a Bose-Chaudhuri-Hocquenghem (BCH) format, the first ECC function includes syndrome calculation and key calculation.

Then, the data from the first half of the current page can be moved from the second buffer level to the first part of the third buffer level 3_BUF_A (1206).

In a manner that can overlap in time with moving the first half of the current page to the third-level buffer, the first ECC function can be executed over a second part of the current page in the second-level buffer (1207).

After it is moved to the third-level buffer, the first part of the current page can be moved to the interface via combinational logic to perform the second ECC function (1208). The second ECC function can be a Chien search in the BCH example. This operation of moving data from the second-level buffer to the interface can be a byte-by-byte operation, or an operation that is executed using data units equal to the bus width.

After the first ECC function is executed over the second half of the current page, it can be moved to the second half of the third-level buffer (1209), in a manner that can overlap in time with the movement of the data of the first half of the page to the interface.

After the first part of the current page is moved to the interface while being processed by the second ECC function, the second part of the current page can be moved to the interface via combinational logic to perform the second ECC function, to complete the read of the current page (1210).

The procedure shown in FIGS. 11 and 12 can represent the logic in a controller on an integrated circuit memory device, such as that shown in FIG. 1, including a three-level buffer structure like that of FIG. 9 or FIG. 10.

A device having a controller, and a method responsive to a command sequence for continuous read, are described herein.

A device having a controller, and a method responsive to a command sequence for continuous read including non-sequential pages, are described herein.

A device having a controller, and a method for continuous read of non-sequential pages, are described, including accepting a first command specifying a starting address, and outputting sequential pages in response, starting with the first starting address, while outputting sequential pages in response to the first starting address, accepting a second command specifying a second starting address out of sequence relative to the sequential pages of the first command, and after accepting the second command and a page from the first sequence completes, outputting sequential pages in response, starting with the second starting address.

A device having a controller and a method are described, including a continuous read operation including a command with page address input which can be inserted in the continuous read (similar with Cache Read) to eliminate the read latency between non-sequential pages.

A device having a controller, and a method, are described including a continuous read operation including a command with page address input which can be inserted in the continuous read, the command will have the next page address which will be downloaded to the page buffer.

A device having a controller, and a method, are described including a continuous read operation including a command with page address input which can be inserted in the continuous read; the command will have the next page address which will be downloaded to the page buffer, in which the command is issued on each page.

A device having a controller, and a method, are described including a continuous read operation including a command with page address input which can be inserted in the continuous read; the command will have the next page address which will be downloaded to the page buffer, in which the command is only issued when there is a non-sequential page case.

A device having a controller and a method are described responsive to a command sequence for continuous read including multiple cache levels for ECC operations.

A device having a controller and a method are described for continuous read of sequential pages, including moving pages through a page buffer, a first stage data cache and a second stage cache with ECC operations using first and second stage caches (as second and third-level buffers).

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a memory array including a plurality of bit lines;
a page buffer coupled to the plurality of bit lines having a page width;
an input/output interface for I/O data units having an I/O width less than the page width;
data path circuits connected between the page buffer and the interface, the data path circuits including a second buffer level and a third buffer level;
a controller responsive to commands received at the input/output interface, to control memory operations including a continuous page read operation to output a stream of pages at the input/output interface, the continuous read operation including transferring a page of data having a page width from the memory array to the page buffer in a page read interval, transferring the page of data from the page buffer to the second buffer level, transferring the page of data from the second buffer level to the third buffer level, and transferring the page of data from the third buffer level to the input/output interface; and
ECC circuits connected to the data path circuits, which execute an ECC operation on pages in the data path circuits.

2. The device of claim 1, wherein the ECC operation includes a first ECC function on pages held in the data path circuits and a second ECC function during transfer of data in the stream of pages of the continuous read operation from the data path circuits to the input/output interface.

3. The device of claim 2, including a buffer data bus system operable to connect the ECC circuits to the second buffer level for execution of the first ECC function.

4. The device of claim 2, wherein:
the second buffer level is coupled to the page buffer by a data path for transfer of a page and ECC bits from the page buffer to the second buffer level; and
the third buffer level includes first and second parts coupled to the second buffer level by a first inter-buffer data path for transfer of a first part of a page and ECC bits from the second buffer level to the first part of the third buffer level and a second inter-buffer data path for transfer of a second part of a page and ECC bits from the second buffer level to the second part of the third buffer level,
a buffer data bus system operable to connect the ECC circuits to each of the first and second parts of the third buffer level for execution of the first ECC function, and to connect each of the first and second parts of the third buffer level via combinational logic for the second ECC function to the input/output interface, the buffer data bus system having a bus width Z, the first and second parts of the third buffer level having a buffer width Y, the page buffer having a page width X, where Z<Y<X.

5. The device of claim 4, wherein the first ECC function includes operating sequentially over data in a selected one of the first and second parts of the third buffer level, and the second ECC function includes modifying data in transit from a selected one of the first and second parts of the third buffer level to the input/output interface.

6. The device of claim 2, wherein the first ECC function comprises syndrome calculation and key calculation, and the second ECC function comprises Chien search.

7. The device of claim 3, wherein the second buffer level includes first and second parts, coupled to the page buffer by a buffer data path for transfer of a first part of a page and ECC bits from the page buffer to the first part in one memory cycle, and for transfer of a second part of a page and ECC bits from the page buffer to the second part of the second buffer level in one memory cycle; and wherein:

the buffer data bus system is operable to connect the ECC circuits to each of the first and second parts of the second buffer level for execution of the first ECC function, and to connect each of the first and second parts of the third buffer level via combinational logic for the second ECC function to the input/output interface.

8. The device of claim 1, wherein the ECC operation includes a first ECC function executed on pages held in one of the second level buffer and the third level buffer of the data path circuits, and a second ECC function executed on pages held in one of the second level buffer and the third level buffer of the data path circuits.

9. The device of claim 1, wherein the memory array comprises NAND flash memory.

10. The device of claim 1, wherein the input/output interface comprises a Serial Peripheral Interface SPI port.

11. A method for operating a memory device for a read of a stream of pages, the device including a page buffer, a second buffer level, a third buffer level and an input/output interface, comprising:

moving data of a preceding page from the page buffer to the second buffer level, and transferring a current page from a memory array to the page buffer;

moving data of the preceding page from the second buffer level to the third buffer level and transferring the current page from the page buffer to the second buffer level;

transferring data from a first part of the preceding page from the third buffer level to the interface, and then transferring data from a second part of the preceding page from the third buffer level to the interface;

transferring data from a first part of the current page from the second buffer level to the third buffer level, and then transferring data from a second part of the current page from the second buffer level to the third buffer level; and performing an ECC operation during transfer of the current page from the page buffer to the interface through the second and third buffer levels.

12. The method of claim 11, wherein performing the ECC operation includes:

executing a first ECC function and executing a second ECC function;

transferring a first part of the current page to the third buffer level and executing the first ECC function over data in the first part of the current page in the third buffer level, overlapping in time with transferring the second part of the preceding page to the interface, and transferring a second part of the current page to the third buffer level and executing the first ECC function over data in the second part of the current page in the third buffer level; and transferring the first part of the current page while executing the second ECC function on the first part of the current page to the input/output interface, overlapping in time with executing the first ECC function over data in the second part of the current page in the third buffer level, and then transferring the second part of the current page while executing the second ECC function on the second part of the current page to the input/output interface.

13. The method of claim 11, including transferring the first part of the page from the second buffer level to the third buffer level in one buffer memory cycle.

14. The method of claim 11, including transferring the first part of the page from the page buffer to the second buffer level in one buffer memory cycle.

15. The method of claim 11, wherein performing the ECC operation includes executing a first ECC function and executing a second ECC function, and including executing the first ECC function over data in the second buffer level and performing the second ECC function while transferring the data to the input/output interface.

16. The method of claim 11, wherein performing the ECC operation includes executing a first ECC function and executing a second ECC function, and including executing the first ECC function over data in one of the second buffer level and the third buffer level, and performing the second ECC function over data one of the second buffer level and the third buffer level.

17. The method of claim 11, wherein performing the ECC operation includes executing a first ECC function and executing a second ECC function, and including executing the first ECC function over data in the third buffer level and performing the second ECC function while transferring the data to the input/output interface.

18. The method of claim 16, wherein the first ECC function comprises syndrome calculation and key calculation, and the second ECC function comprises Chien search.

19. The method of claim 17, wherein the first ECC function comprises syndrome calculation and key calculation, and the second ECC function comprises Chien search.

20. The device of claim 10, wherein the memory array comprises NAND flash memory.

* * * * *